(12) United States Patent
Rosner et al.

(10) Patent No.: US 8,359,423 B2
(45) Date of Patent: Jan. 22, 2013

(54) USING LPDDR1 BUS AS TRANSPORT LAYER TO COMMUNICATE TO FLASH

(75) Inventors: Stephan Rosner, Campbell, CA (US); Qamrul Hasan, Santa Clara, CA (US); Roger Dwain Isaac, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 846 days.

(21) Appl. No.: 12/048,474

(22) Filed: Mar. 14, 2008

(65) Prior Publication Data

US 2009/0235012 A1    Sep. 17, 2009

(51) Int. Cl.
*G06F 13/00* (2006.01)
(52) U.S. Cl. ............ 711/103; 711/5; 711/101; 711/105; 711/154; 711/170; 710/5; 710/14; 710/100
(58) Field of Classification Search .................. None
See application file for complete search history.

(56) References Cited

U.S. PATENT DOCUMENTS

2006/0230250 A1* 10/2006 Klint et al. .................... 711/200
2007/0028031 A1*  2/2007 Peterson et al. .............. 711/103

* cited by examiner

*Primary Examiner* — Matthew Bradley
*Assistant Examiner* — Alan Otto
(74) *Attorney, Agent, or Firm* — Eschweiler & Associates, LLC

(57) ABSTRACT

One embodiment of the present invention relates to a method for communicating NOR-type flash specific memory commands from a DRAM memory controller to a NOR-type flash memory array without disrupting DRAM operation. In this embodiment flash specific commands are channeled from the DRAM controller to the flash device by using the DRAM protocol as a transport layer. Data to be written to the NOR-type flash memory array are loaded into a data register and a sequence of programming commands are loaded into a mode register as a series of mode register write operations. Once the entire sequence of programming commands is loaded the NOR-type flash memory array the data in the data register is loaded into the NOR-type flash memory array. Other methods and circuits are also disclosed.

18 Claims, 17 Drawing Sheets

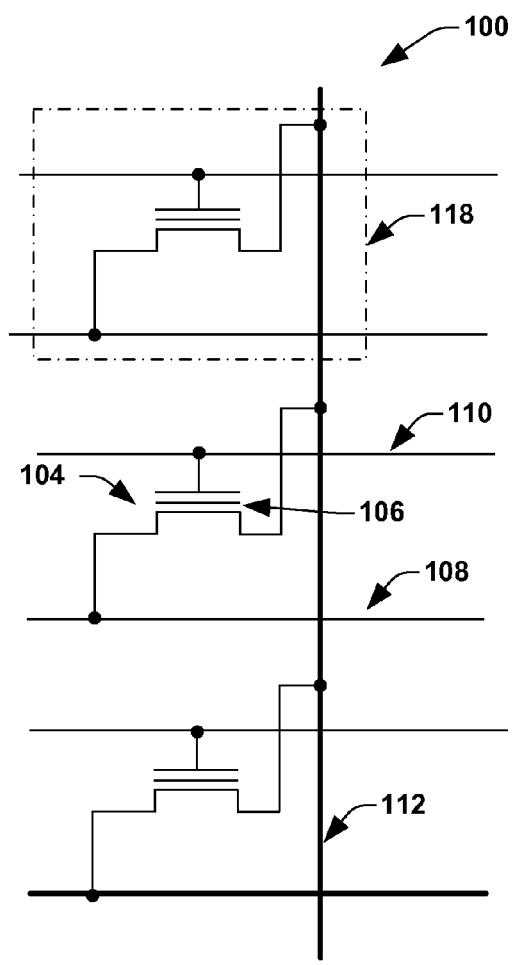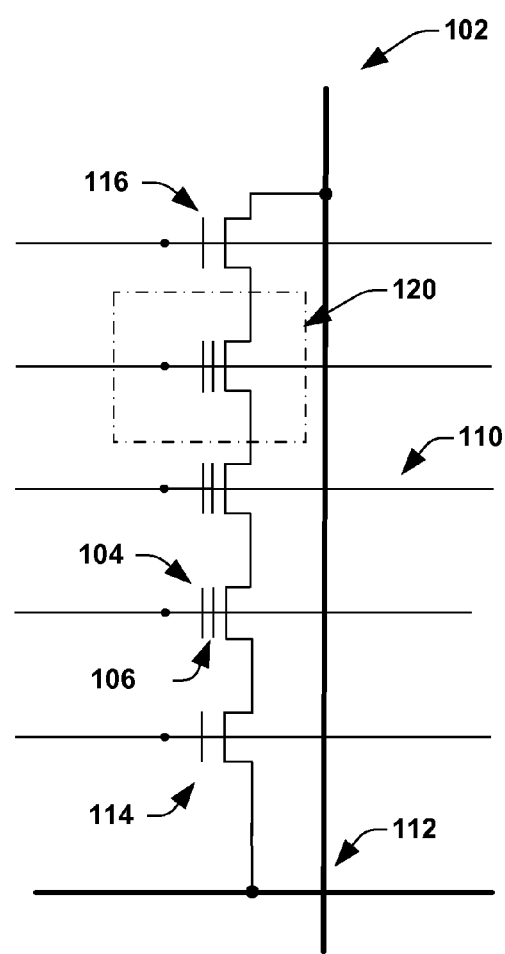
FIG. 1A  FIG. 1B

USING LPDDR1 BUS AS TRANSPORT LAYER TO COMMUNICATE TO FLASH

FIELD OF INVENTION

The present invention relates generally to memory devices and the like and in particular to a memory architecture comprising a non-volatile memory array and a random access memory array.

BACKGROUND OF THE INVENTION

In the past decade the portable electronics industry has made enormous technological strides. Today, portable electronics, such as cell phones, MP3 players, digital cameras, etc., offer a greater range of services and smaller sizes than ever before. A large reason for the advances that have occurred in the portable electronics sector has been advances in integrated chip memory.

Memory used in integrated chips can be broadly categorized into two main categories: non-volatile memory and volatile memory. Non-volatile memory is memory that does not require power to maintain its data. There are numerous types of non-volatile memories on the market including Electrically Erasable Programmable Read-Only Memory (EEPROM), Erasable Programmable Read-Only Memory (EPROM), and flash memory. In recent years flash memory has dominated the market of non-volatile memory. Flash memory has the ability to erase a single memory cell at a time and offers higher density and faster read times than other forms of non-volatile memory.

Volatile memory requires a constant power supply to maintain its data. From a performance point of view, volatile memory is superior to non-volatile memory, offering faster read and write speeds at higher density. The most commonly used volatile memories are static random access memory (SRAM) and dynamic random access memory (DRAM). SRAM offers high read speed and low power consumption, while DRAM offers high density memory at a low cost. In today's integrated chips, both SRAM and DRAM offer higher performance and larger density than ever before.

Unfortunately, to receive the higher performance of volatile memory over non-volatile memory it is necessary to increase the power consumption of the chip. In recent years, certain markets such as the high end cell phone market have looked to combine the advantages of volatile and non-volatile memories. They have developed memory architectures to take advantage of different memory properties within the same chip. For example, in the past few years it has become popular to combine non-volatile NAND-type flash memory with volatile random access memory (RAM). This combination provides the advantages of high density, low power non-volatile memory (NVM) of the NAND-type flash with the high performance, high density of volatile RAM memories. However, even this architecture fails to realize all the advantages of flash and RAM based memories.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a NVM/DRAM computer architecture wherein a NOR type flash memory array receives a dynamic protocol from a dynamic memory controller without disrupting DRAM operation. In this embodiment flash specific commands are channeled from the DRAM controller to the NOR-type flash memory array by using the DRAM protocol as a transport layer. Data to be written to the NOR-type flash memory array is loaded into a data buffer located behind a digital bus interface shared between the DRAM and NOR-type flash memory arrays and addresses corresponding to the mode register and the NOR-type flash memory array are loaded into an address register located on the digital bus interface. A sequence of program commands are then sent from the dynamic memory controller to an address location associated with the mode register. When loading the sequence of program commands to the mode register is completed, the data in the data buffer is loaded into the NOR-type flash memory array. When data loading is completed, the NOR-type flash memory array writes a done bit to the mode register, thereby communicating to the dynamic memory controller that communication can resume. Other embodiments and methods are also disclosed.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 1A shows an exemplary NOR-type flash memory architecture;

FIG. 1B shows an exemplary NAND-type flash memory architecture;

DETAILED DESCRIPTION OF THE INVENTION

Figure 2:
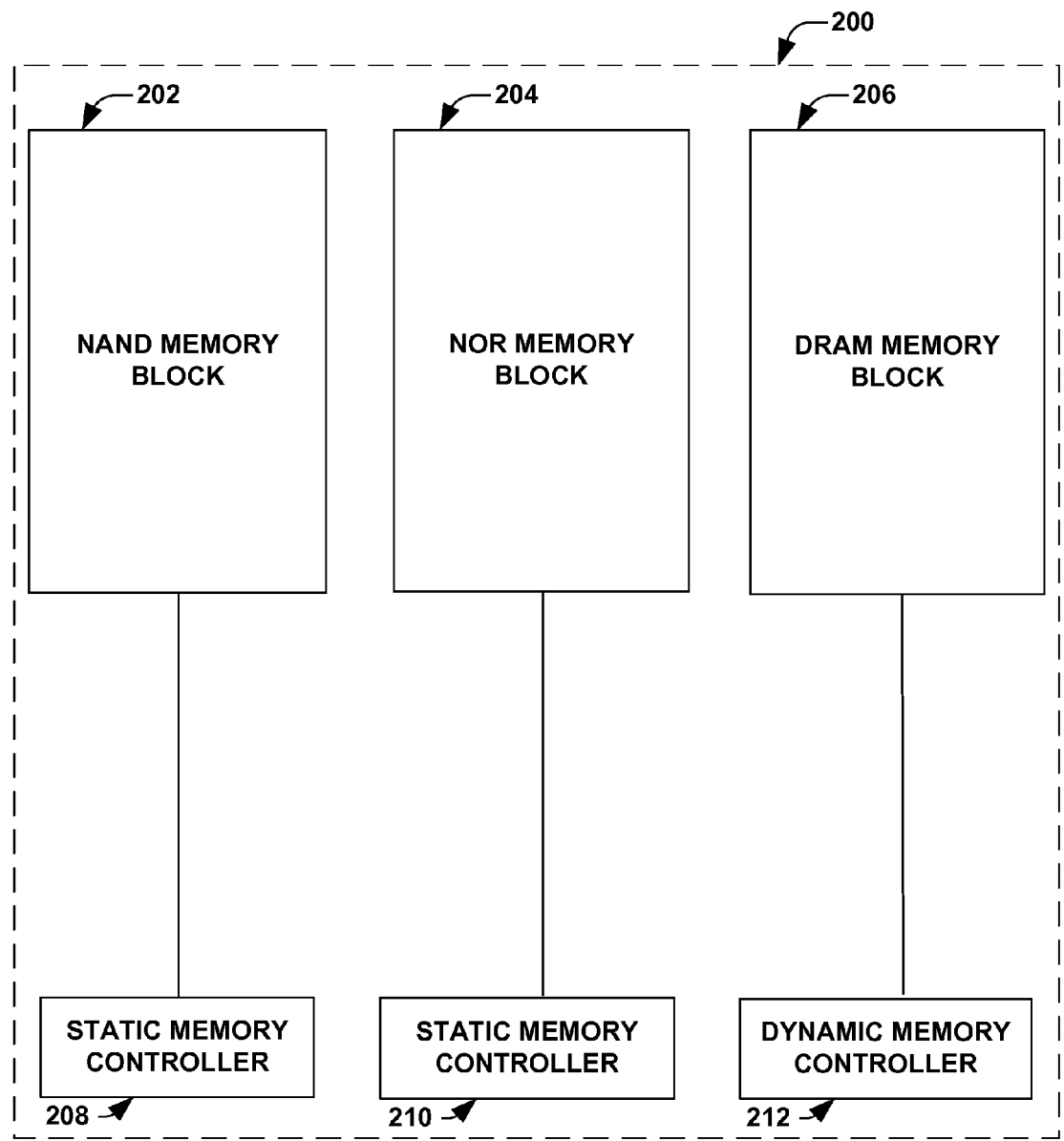
FIG. 2 shows a NVM/DRAM memory architecture.

The present invention will now be described with reference to the attached drawing figures, wherein like reference numerals are used to refer to like elements throughout, and wherein the illustrated structures and devices are not necessarily drawn to scale.

FIG. 1A shows a section of a NOR-type flash memory array 100. NOR-type flash memory arrays are formed from a plurality of MOSFET devices. Each MOSFET device 104 contains a charge trapping layer 106 between the gate and the source/drain of the device. The charge trapping layer may comprise an oxide nitride oxide (ONO) tri-layer structure, for example. Each transistor 104 is electrically connected to a plate line 108, a word line 110, and a bit line 112. Plate lines 108 and word lines 110 are commonly connected to memory cells which are horizontally aligned. Bit lines 112 are common connected to memory cells that are vertically aligned. Through selectively applying electrical pulses to the plate lines 108, word lines 110, and bit lines 112 a particular memory cell can be accessed for an specific operation (e.g., read, write).

FIG. 1B shows a section of a NAND-type flash memory array 102. NAND-type flash memory arrays are also formed from a plurality of MOSFET devices 104. In a NAND-type flash memory array 102 the devices 104 are organized in series with each other, connecting the source/drain of one device with the drain/source of an adjacent device. Each individual device in 102 is connected to a separate word line 110 and, unlike the NOR-type flash memory architecture, the device chain is connected to a common bit line 112. On the one end of each device chain is a bit line selection device 116. This device will be turned on when the bit line it is attached to is operated. On the other end of the device is a ground selection device 114. This device is turned on when certain operations are performed. The bit line selection 116 and ground selection 114 devices are typical MOSFET devices. All other devices are storage devices 104 comprising a composite charge trapping layer 106 between the gate and the source/drain of the device.

The differences in architecture between NAND and NOR type flash memories give each type of architecture its own set of particular advantages and disadvantages. NAND-type flash memories are advantageous over NOR-type flash memories in terms of density and program and erase times. On the other hand, NOR-type flash memories have shorter access time than NAND memories.

FIGS. 1A and 1B also show a unit cell for a NAND-type flash memory and a NOR-type flash memory. The NAND-type unit cell 120 is smaller than the NOR-type unit cell 118. This smaller unit cell allows formation of a higher density memory. In general, the unit cell size of a NOR-type unit cell 118 is about twice that of NAND-type unit cell 120. This size difference results in a significantly higher silicon area cost per bit.

Also, because of their architecture NAND-type flash memory arrays are accessed in blocks, rather than as a single memory cell. NOR-type memory flash arrays can be accessed one cell at a time, in a manner similar to random access memories. Further, NAND-type flash memory arrays are more prone to errors than NOR-type flash memory arrays, and typically require error code correction (ECC) to ensure data fidelity.

The short access time and RAM like access offered by NOR-type flash memory arrays has important applications for design. Execute-in-place (XiP) technology is one such application. Execute-in-place systems allow code, such as operating systems or baseband stacks, to be executed directly from the memory. This avoids requiring code stored in flash memory to be loaded into RAM prior to execution. For mobile electronics, XiP is important to the electronics component's speed and power consumption.

FIG. 2 shows a block diagram of a data processing system 200 comprising a NAND memory block 202, a NOR memory block 204, and a DRAM memory block 206. Each memory block is associated with its own memory controller. Each memory controller uses a different bus protocol to communicate with its respective memory block. The NAND memory block 202 and the NOR memory block 204 are respectively coupled to first and second static memory controllers, 208 and 210, which use static bus protocols to communicate. The DRAM memory block 206 is coupled to a dynamic memory controller 212 and uses a dynamic bus protocol to communicate.

By offering a combination of NAND, NOR, and DRAM memory, the memory architecture of FIG. 2 allows a designer to choose between varying degrees of power-consumption, performance, and data retention. However, FIG. 2's implementation has a number of shortcomings. For example, coupling the NOR memory block 204 to the static memory controller 210 using a NOR bus forms a memory architecture requiring three ports as opposed to the two ports that have become standard in NAND/DRAM architectures used by the industry. Further, even for chips that do have three ports, the addition of the NOR-type flash memory array onto its own NOR bus increases the number of pins used and drives up cost and complexity of the chip by requiring more routing and design. This is especially true as a NOR bus is very pin cost intensive and may require 50-60 extra pins, for example.

Figure 3A:
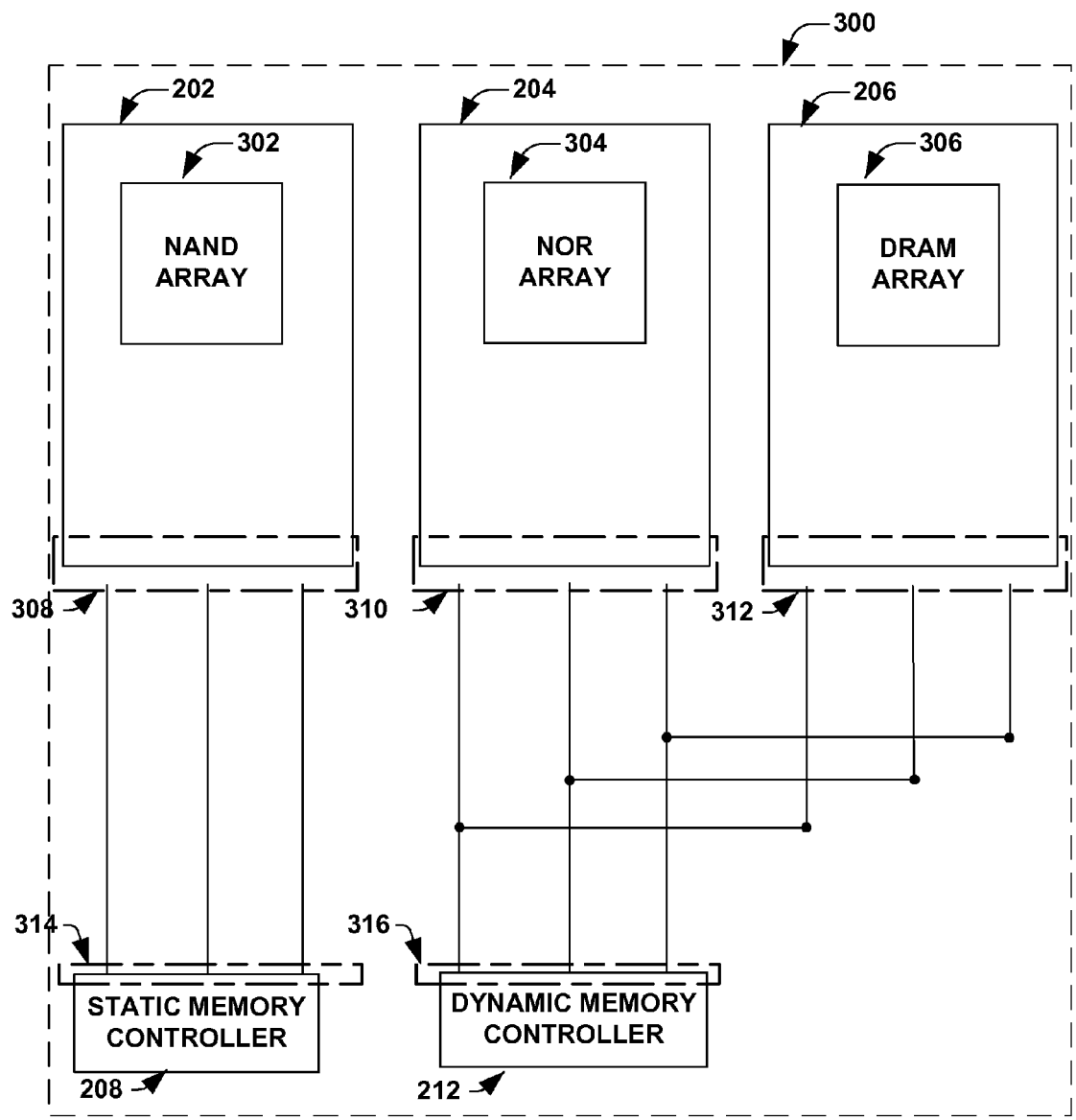
FIG. 3A shows a block diagram of one embodiment of the present invention, wherein a first digital bus interface of a NOR-type flash memory array and a third digital bus interface of a DRAM memory array are coupled to a second digital bus interface of a dynamic memory controller.

FIG. 3A shows a block diagram of a data processing system 300 in conjunction with a first embodiment of the present invention. In FIG. 3A the data processing system 300 comprises a NAND memory block 202 further comprising a NAND-type memory array 302, a NOR memory block 204 further comprising a NOR-type flash memory array 304, and a DRAM memory block 206 further comprising a DRAM memory array 306.

The NAND memory block 202 receives static protocol commands from the static memory controller 208. To facilitate this behavior, the NAND memory block 202 and the static memory controller 208 include first and second static bus interfaces, 308 and 304, respectively.

The NOR memory block 204 and the DRAM memory block 206 receive dynamic protocol commands from the dynamic memory controller 212. To facilitate this behavior, the dynamic memory controller includes a second static bus interface and the NOR memory block 204 and the DRAM memory block 206 include first and third dynamic bus interfaces, 310 and 316, respectively.

Compared to previous solutions, this architecture provides reduced pin counts because it reduces the number of pins required for memory controllers. It also allows re-use of circuitry (reducing cost) because it only uses a single static memory controller and a single dynamic memory controller.

Figure 3B:
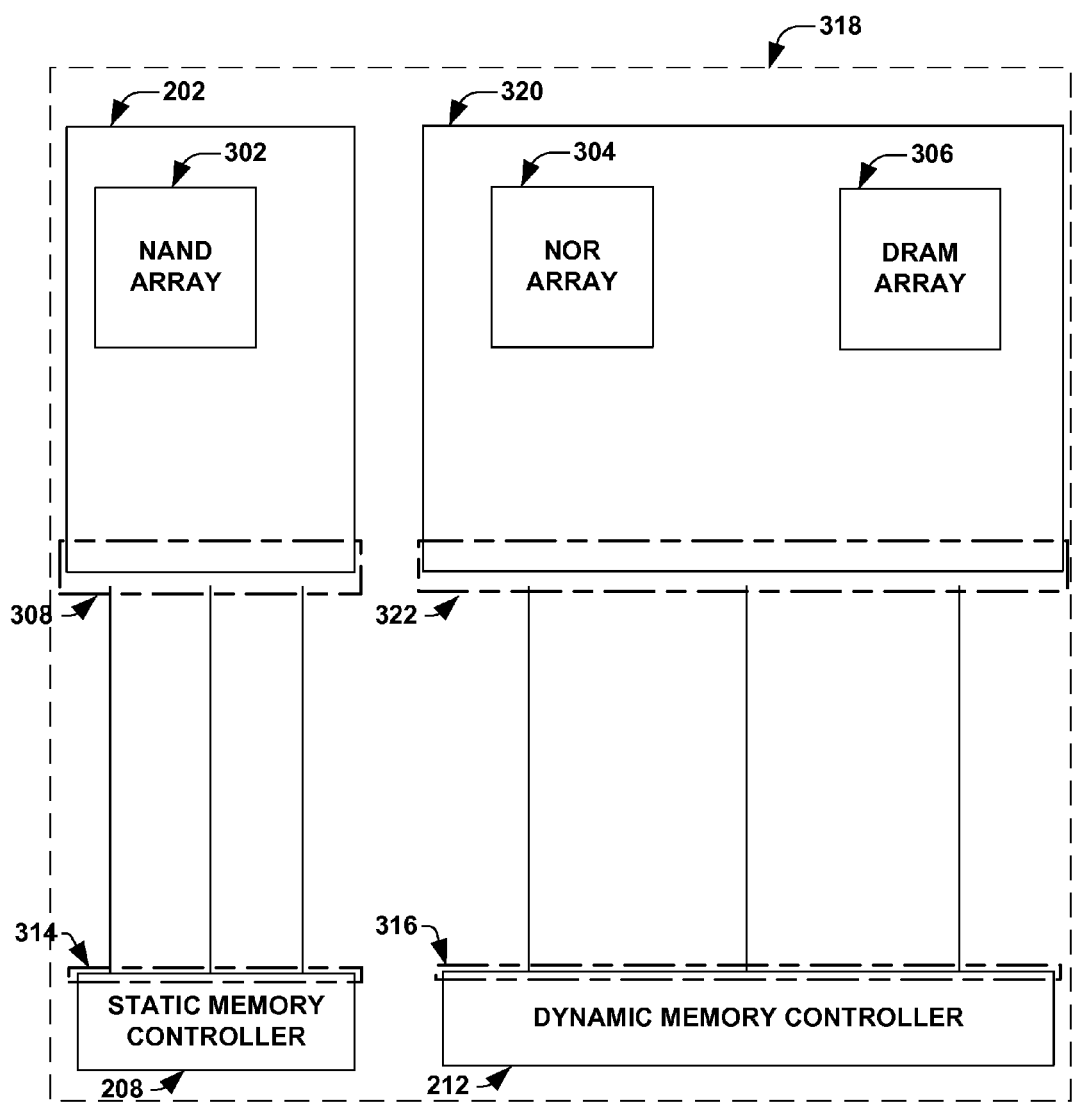
FIG. 3B shows a block diagram of an alternative embodiment of the present invention, wherein a first digital bus interface of a NOR-type flash memory array and a DRAM memory array are coupled to a second digital bus interface of a dynamic memory controller.

FIG. 3B shows a block diagram of a data processing system 318 in conjunction with an alternative embodiment of the present invention. In FIG. 3B the data processing system 318 comprises a NAND memory block 202 further comprising a NAND-type memory array 302 and a NOR/DRAM memory block 320 further comprising a NOR-type flash memory array 304 and a DRAM memory array 306.

The architecture of the NAND memory block 202 and static memory controller 208 are the same as in FIG. 3A. However, the NOR/DRAM memory block 320, which receives dynamic protocol commands from the dynamic memory controller 212, has a common dynamic bus interface 322, shared by both the NOR-type flash memory array 304 and the DRAM memory array 306. Dynamic protocol commands are communicated between the second dynamic bus interface 316 and the common dynamic bus interface 322.

The connection of a NOR-type flash memory array to DRAM buses is a non-obvious modification of existing memory architectures due to the differences in operation between DRAM and flash memory devices. A DRAM memory device is controlled by a straight forward command set issued from a DRAM memory controller. The DRAM controller tracks everything that is done in a DRAM memory array and issues commands based upon how long processes take and what happens next. The operation of flash memory array is more complex than the DRAM memory array operation. The execution of flash operations is based upon many dynamic variables including data patterns, the state of the cells, etc. This complexity makes flash memory operation non-compatible with DRAM operation since it is difficult to predict when processes will complete and when a new command should be issued. Therefore, the simple placement of a NOR-type flash memory array on a DRAM bus will not work properly if the DRAM controller is used to issue flash commands. Further, the command operations of a DRAM memory array and the NOR-type flash memory array are also different. Some operations that exist for a NOR-type flash memory array don't exist at all for DRAM memory array and vice versa. For example, the DRAM pre-charge command is meaningless for flash NVM.

Figure 4A:
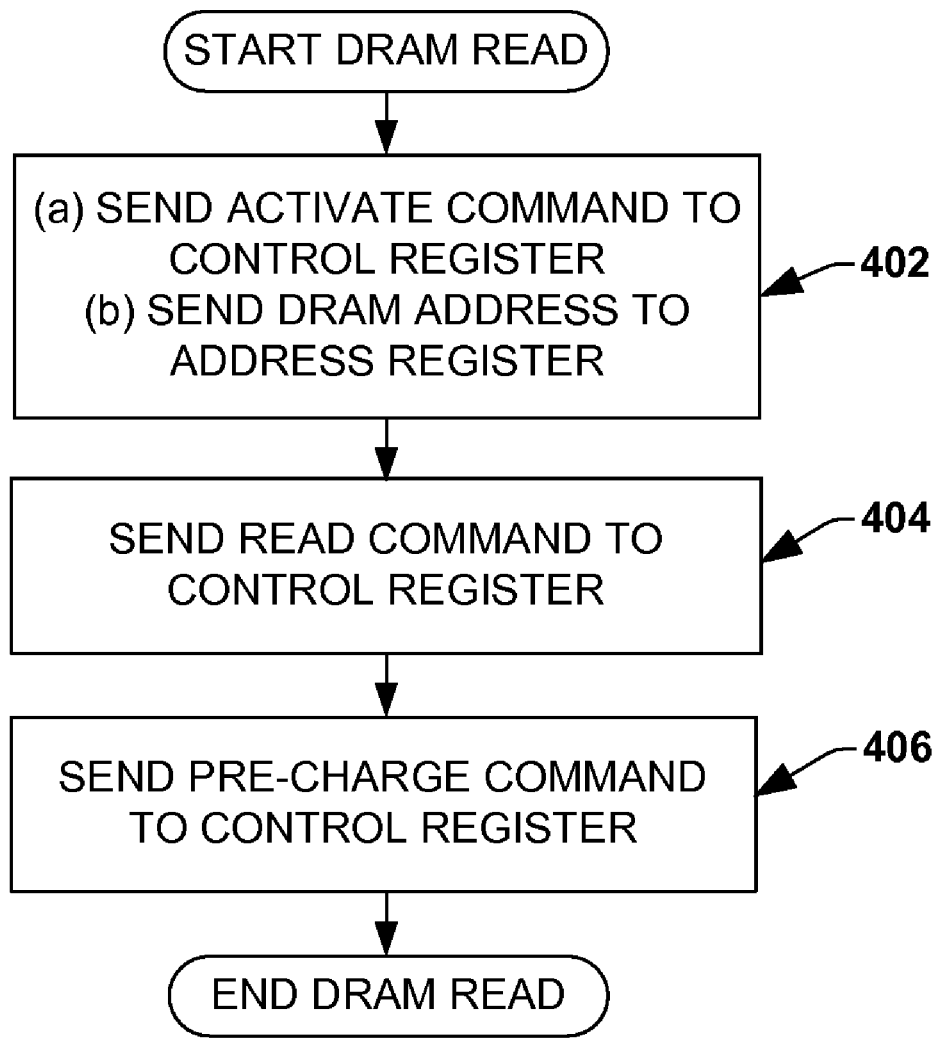
FIG. 4A shows a flow chart for a DRAM memory read operation.

FIG. 4A shows the command sequence communicated between the dynamic memory controller 212 and the DRAM memory array 306 for a DRAM memory read operation.

At 402 the dynamic memory controller 212 concurrently sends an activate command and a DRAM address to the dynamic bus interface associated with the DRAM memory array.

At 404 the dynamic memory controller 212 sends a read command to the dynamic bus interface associated with the DRAM memory array.

At 406, the dynamic memory controller 212 sends an optional pre-charge command to the dynamic bus interface associated with the DRAM memory array.

Figure 4B:
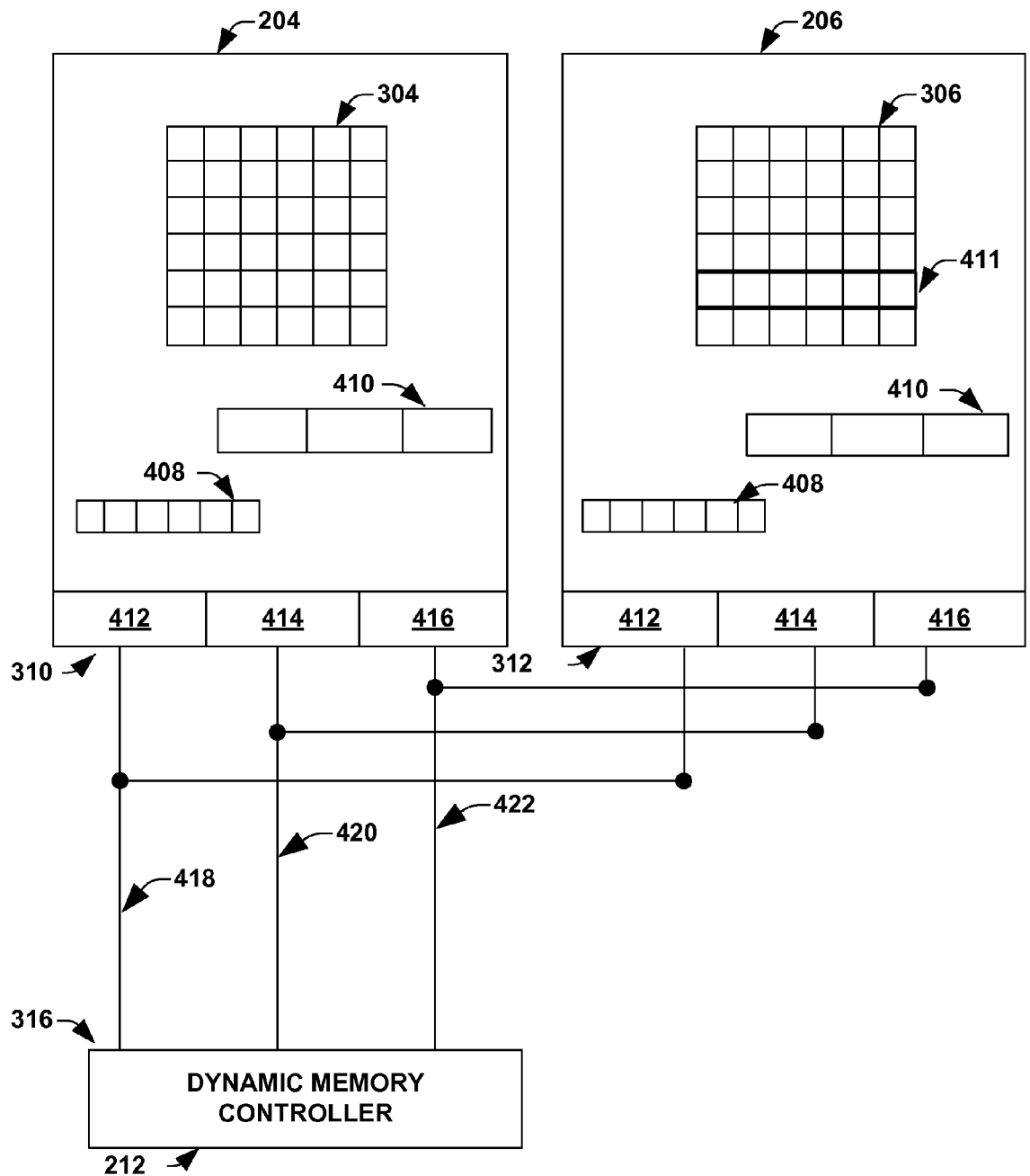
FIG. 4B shows the data flow associated with a DRAM memory read for the memory architecture of FIG. 3A.

A more detailed example of a method for reading from a DRAM memory array, having the memory architecture shown in FIG. 3A, is now set fourth in FIG. 4B.

The DRAM memory read operation begins when the dynamic memory controller 212 concurrently sends an activate command to a control register 416 and a DRAM address to an address register 412. The activate command will cause the DRAM memory array 306 to select a row 411 associated with the DRAM address and copy the contents of the row 411 to a data buffer 408. Usually the size of the row 411 is the same as the size of the data buffer 408 and therefore an entire row is copied to the data buffer 408. However, the size of the data buffer 408 may vary by design.

The dynamic memory controller 212 then sends a read command to the control register 416. The read command selects bits from the content stored in the data buffer 408 and provides the data through a data register 414 and onto a data bus 420.

Finally, the dynamic memory controller 212 sends an optional pre-charge command to the control register 416. The pre-charge command writes data in the data buffer 408 back to the DRAM memory array 306. In a DRAM memory array the pre-charge command is performed since reading is a destructive action. However, the dynamic memory controller 212 will only send the pre-charge command if the row is to be closed. The pre-charge command is skipped if the row is to be left open for further read operations.

Figure 4C:
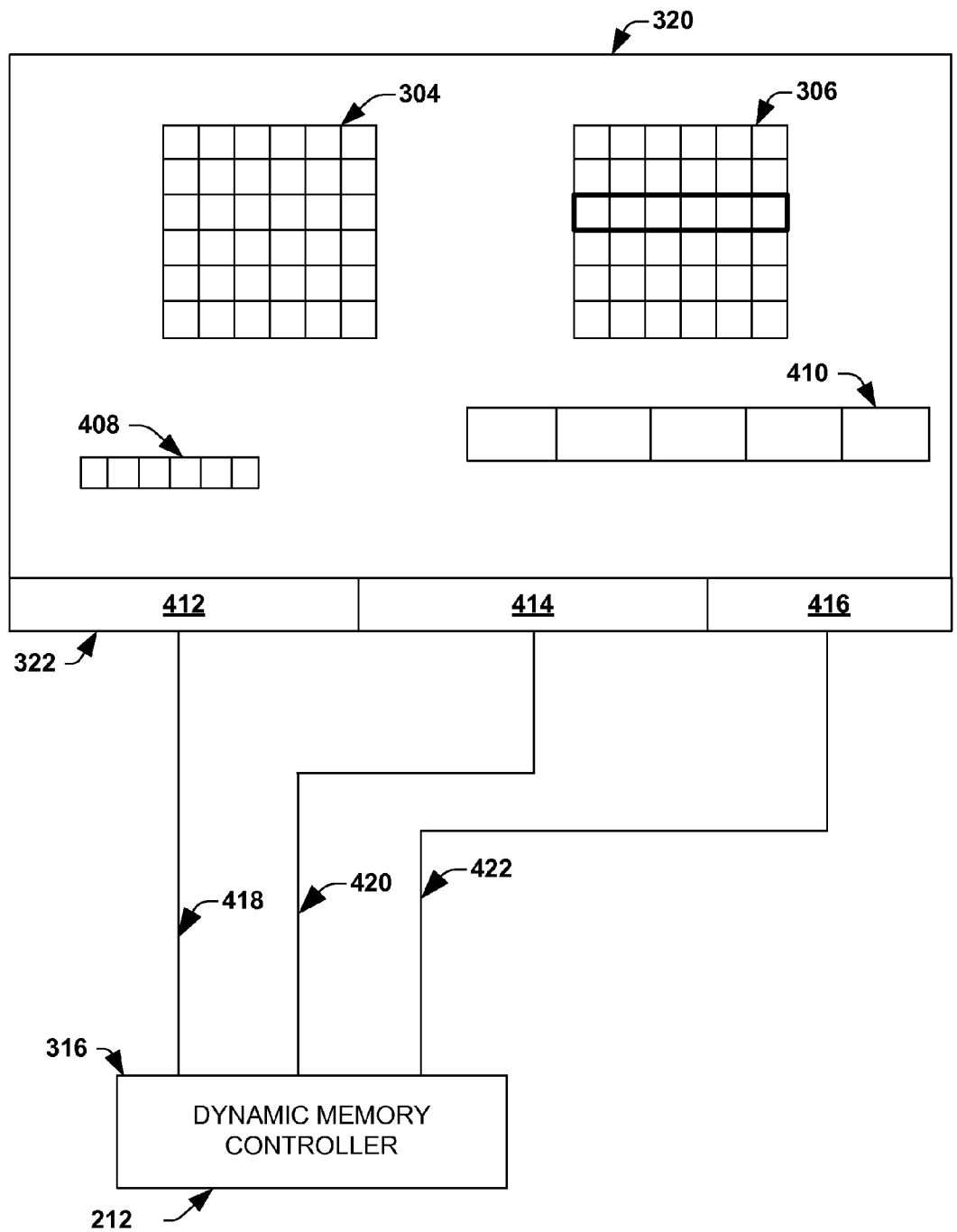
FIG. 4C shows the data flow associated with a DRAM memory read for the memory architecture of FIG. 3B.

FIG. 4C shows another detailed example of a method for reading from a DRAM memory array having the memory architecture shown in FIG. 3B. The read operation data flow is the same as in FIG. 4B, except in FIG. 4C commands are sent from the dynamic memory controller 212 to the common digital bus interface 322.

Figure 5A:
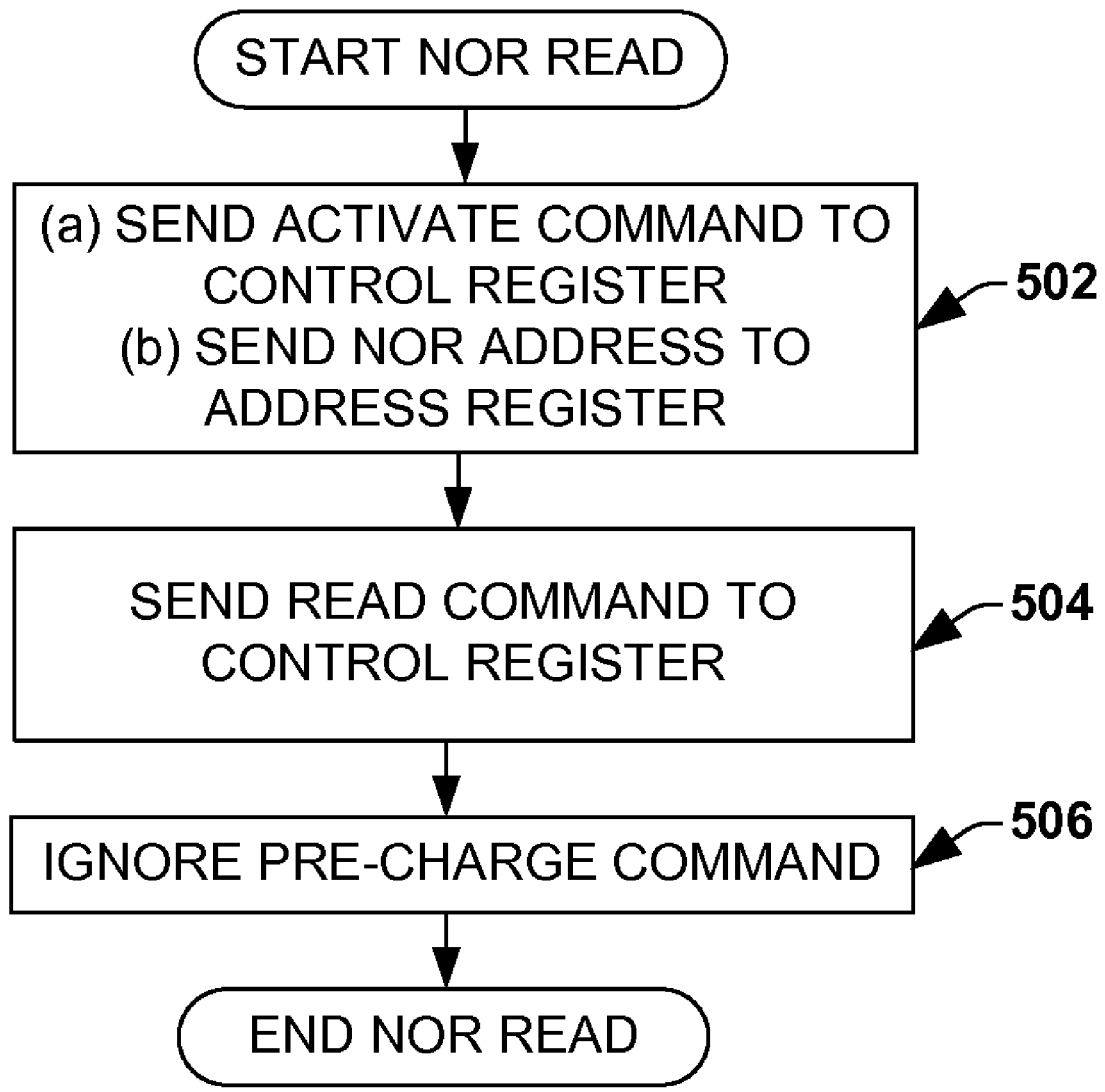
FIG. 5A shows a flow chart for a NOR-type flash memory array read operation.

FIG. 5A shows the command sequence communicated between the dynamic memory controller 212 and the NOR-type flash memory array 304 for a NOR-type flash memory array read operation.

At 502 the dynamic memory controller 212 concurrently sends an activate command and a NOR address to the dynamic bus interface associated with the NOR-type flash memory array.

At 504 the dynamic memory controller 212 sends a read command to the dynamic bus interface associated with the NOR-type flash memory array.

At 506, the dynamic memory controller 212 sends an optional pre-charge command to the dynamic bus interface associated with the NOR-type memory flash array.

Figure 5B:
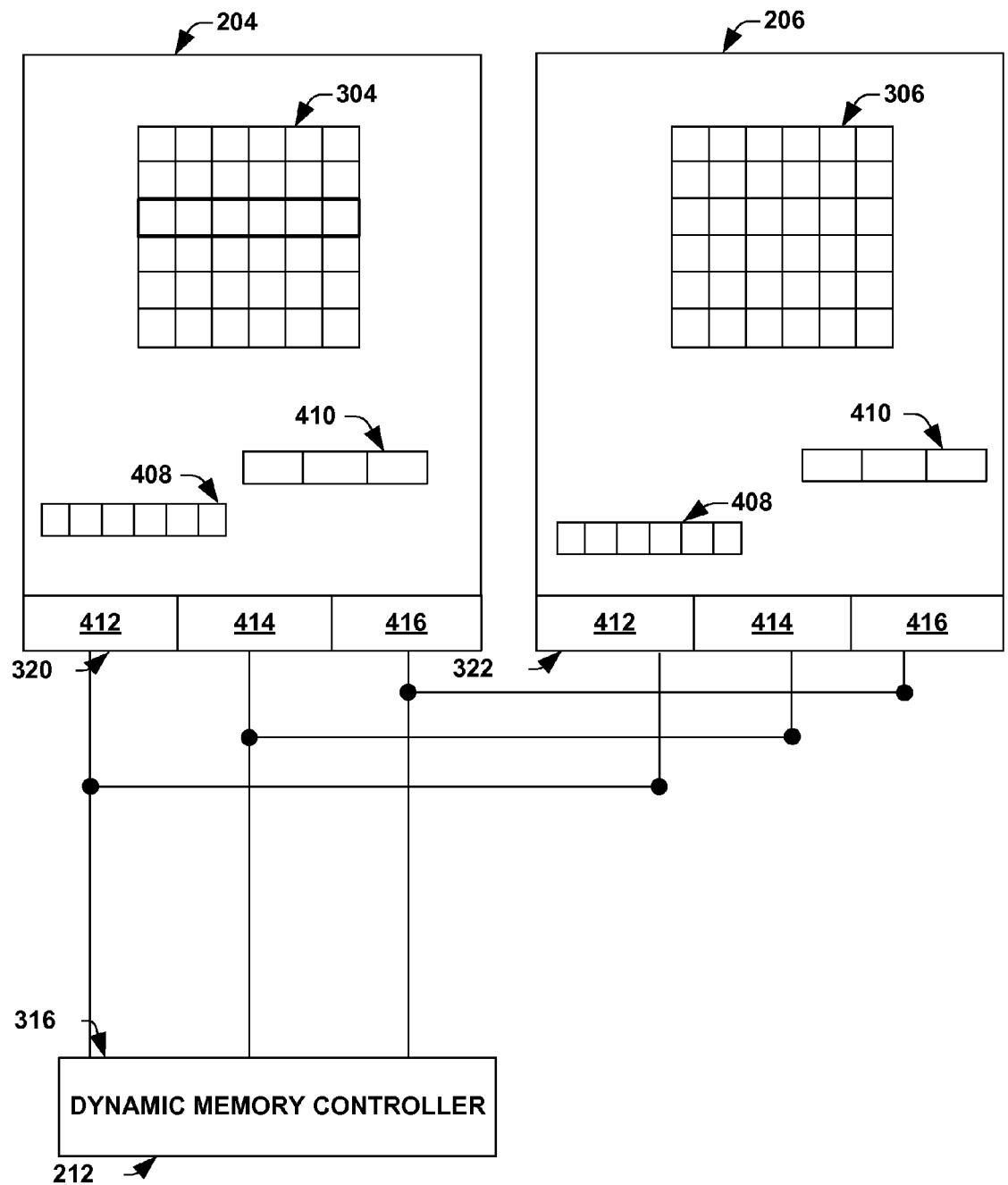
FIG. 5B shows a data flow associated with a NOR-type flash memory array read for the memory architecture of FIG. 3A.
Figure 5C:
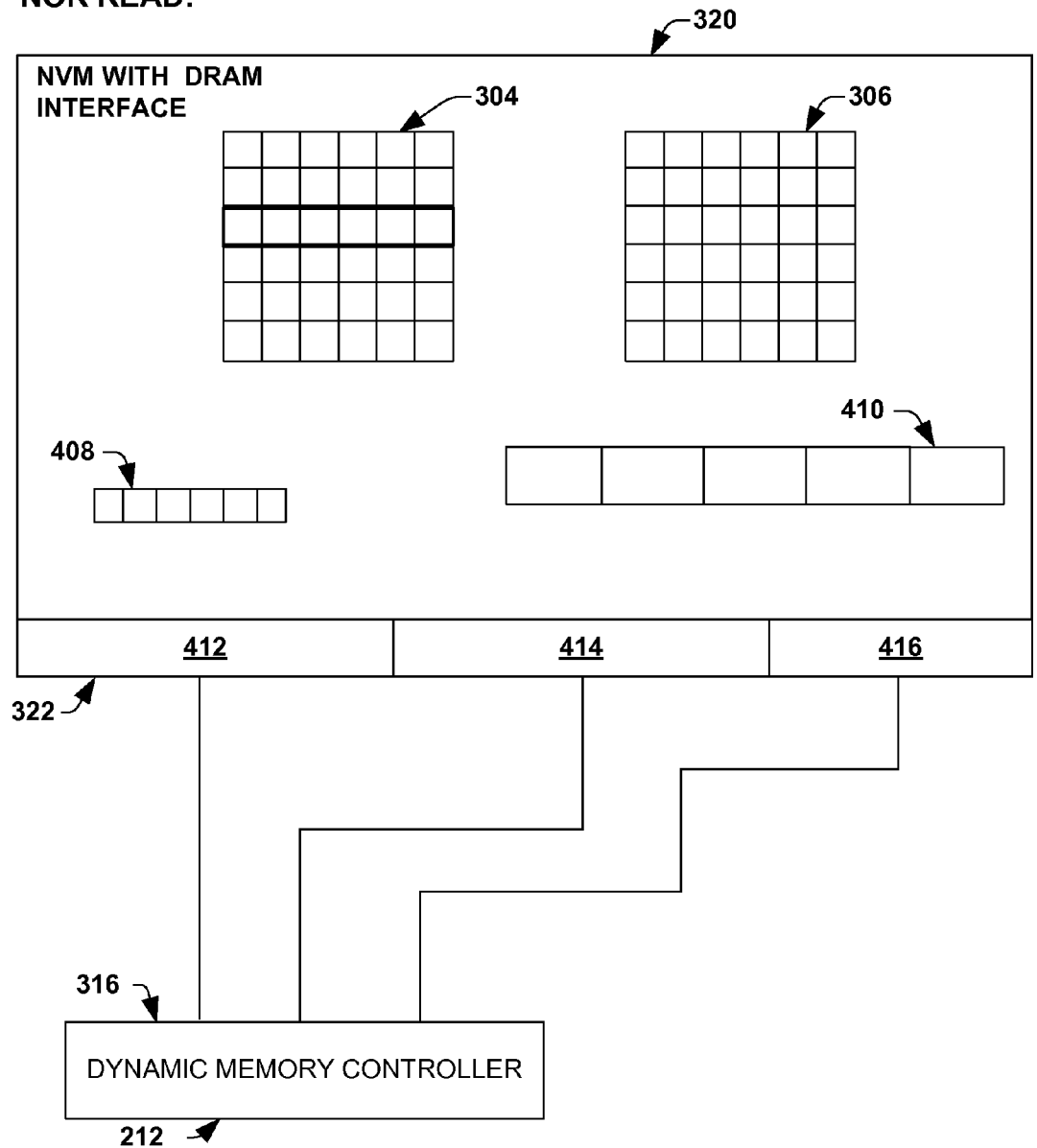
FIG. 5C shows the data flow associated with a NOR-type flash memory array read for the memory architecture of FIG. 3B.

A more detailed example of a method for reading from a NOR-type flash memory array, having the memory architecture shown in FIG. 3A, is now set fourth in FIG. 5B. The NOR read operation begins when the dynamic memory controller 212 concurrently sends an activate command to the control register 416 and an NOR-type flash memory array address to the address register 412.

The dynamic memory controller 212 then sends a read command to the control register 416.

Finally, the pre-charge command sent from the dynamic memory controller 212 is ignored by the NOR-type flash memory array 304. The pre-charge command is ignored since reading of the NOR-type flash memory array is a non-destructive action.

FIG. 5B shows another detailed example of a method for reading from a NOR-type flash memory array having the memory architecture shown in FIG. 3B. The read operation sequence is the same as in FIG. 5B except that the commands are sent from the dynamic memory controller 212 to the common digital bus interface 322 associated with both the NOR-type flash memory array and the DRAM memory array.

Figure 6A:
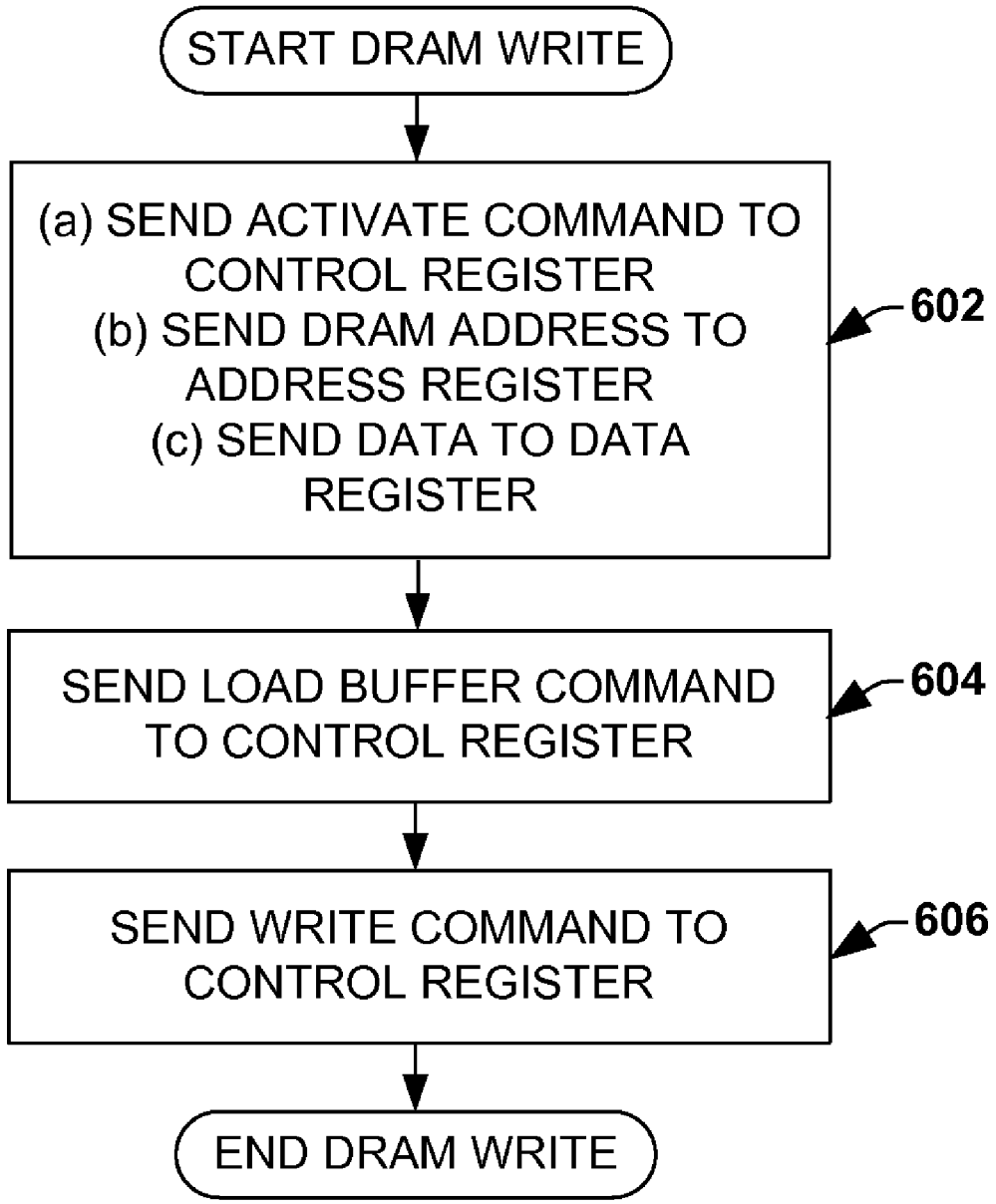
FIG. 6A shows a flow chart for a DRAM memory write operation.

FIG. 6A shows the command sequence communicated between the dynamic memory controller 212 and the DRAM memory array 306 for a DRAM memory write operation.

At 602 the dynamic memory controller 212 concurrently sends an activate command, a DRAM memory array, and the data to be written to the dynamic bus interface associated with the DRAM memory array.

At 604 the dynamic memory controller 212 sends a load buffer command to the dynamic bus interface associated with the DRAM memory array.

At 606 the dynamic memory controller 212 sends a write command to the dynamic bus interface associated with the DRAM memory array.

Figure 6B:
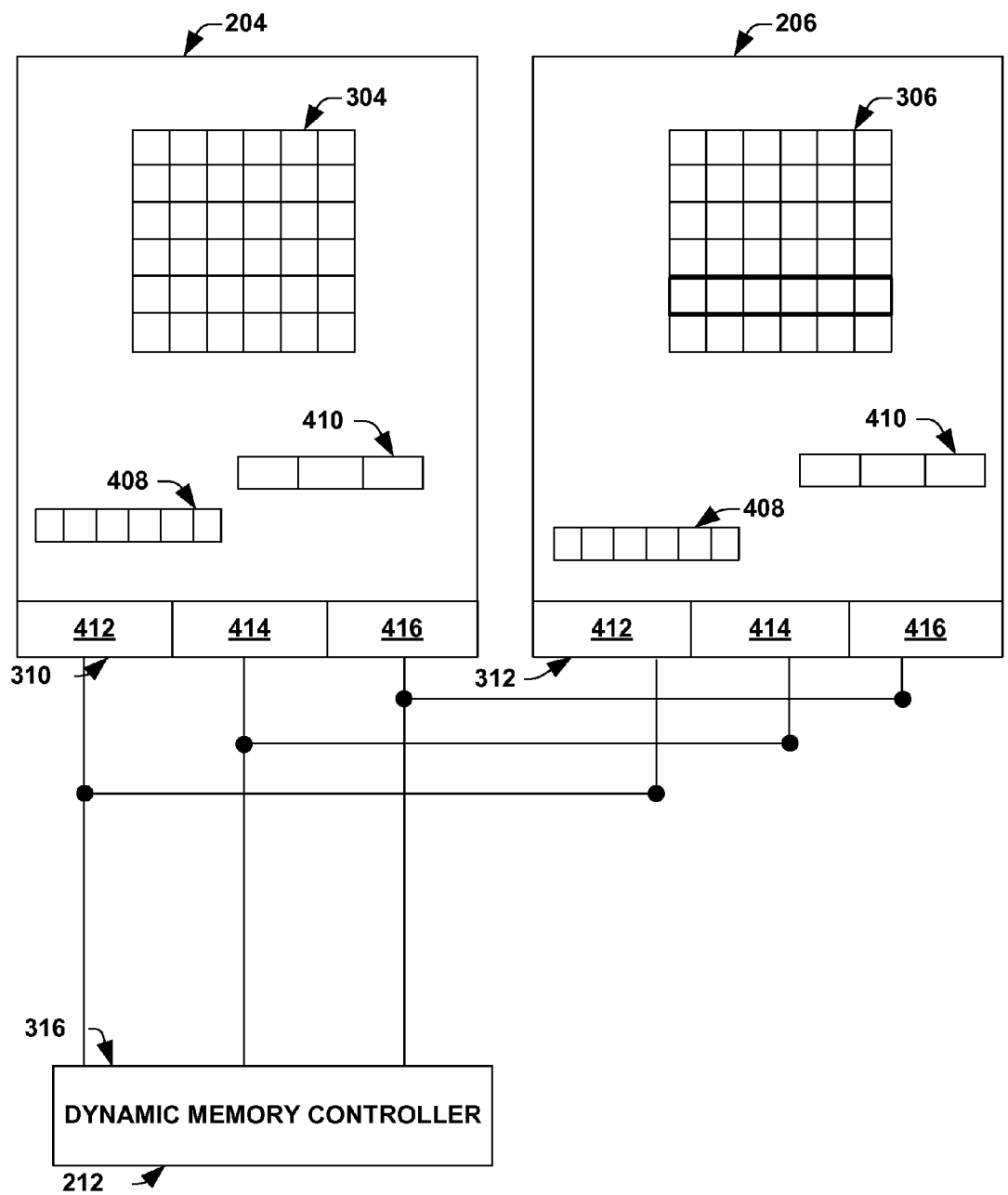
FIG. 6B shows the data flow associated with a DRAM memory write for the memory architecture of FIG. 3A.

A more detailed example of a method for writing to a DRAM memory array, having the memory architecture shown in FIG. 3A, is now set fourth in FIG. 6B. The write operation begins when the dynamic memory controller 212 concurrently sends an activate command to the control register 416, a DRAM memory array address to the address register 412, and the data to be written to the data register 414.

The dynamic memory controller 212 then sends a load buffer command to the control register 416. The load buffer command loads 605 data from the data register 414 to the data buffer 408.

Finally, the dynamic memory controller 212 sends a write command to the control register 416. The write command copies 607 the content of the data buffer 408 to a DRAM memory array location associated with the address stored in the address register 412.

Figure 6C:
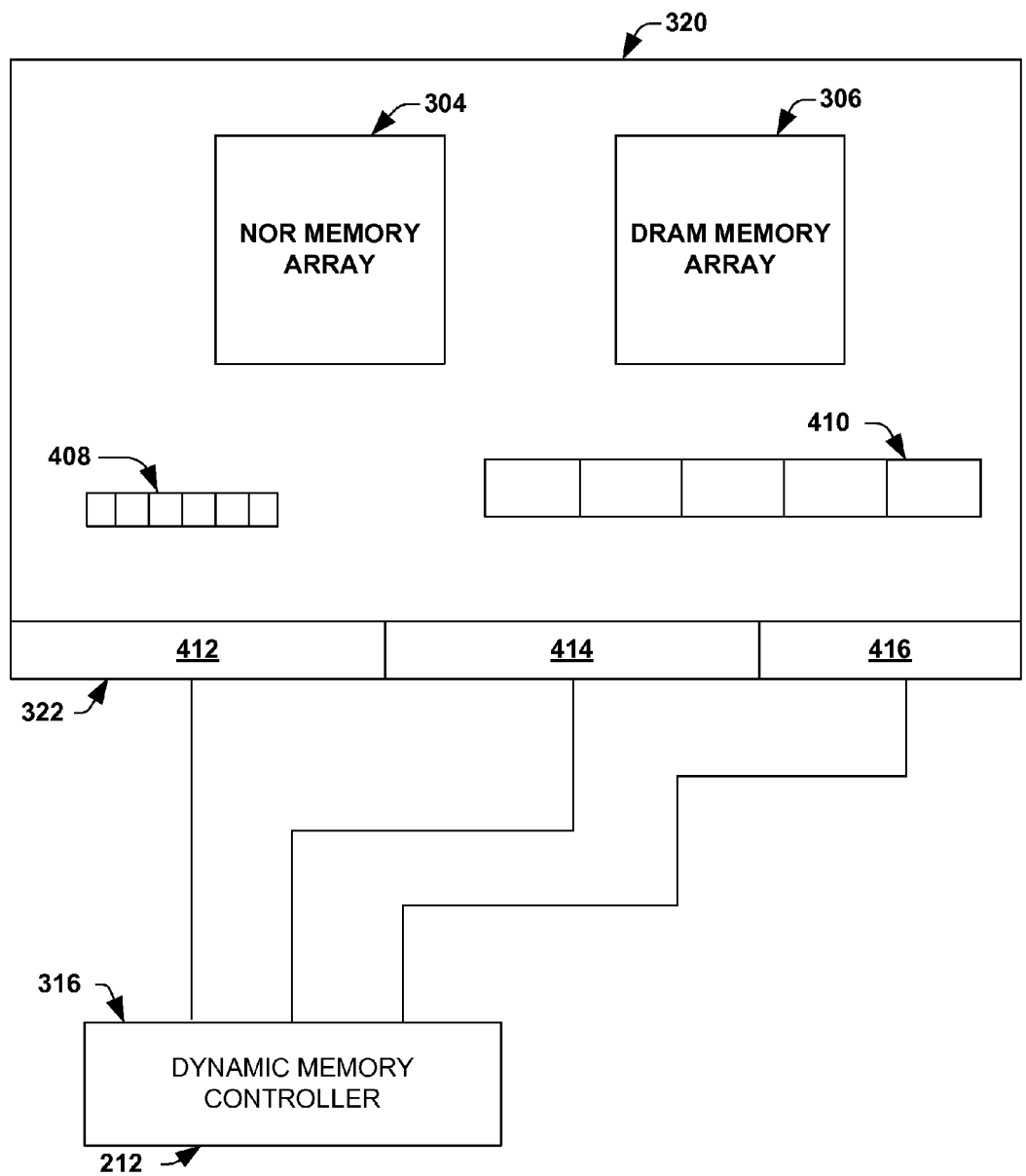
FIG. 6C shows the data flow associated with a DRAM memory write for the memory architecture of FIG. 3B.

FIG. 6C shows another detailed example of a method for writing to a DRAM memory array having the memory architecture shown in FIG. 3B. The write data flow is the same as in FIG. 6B except that the commands are sent from the dynamic memory controller 212 to the common digital bus interface 322.

Figure 7A:
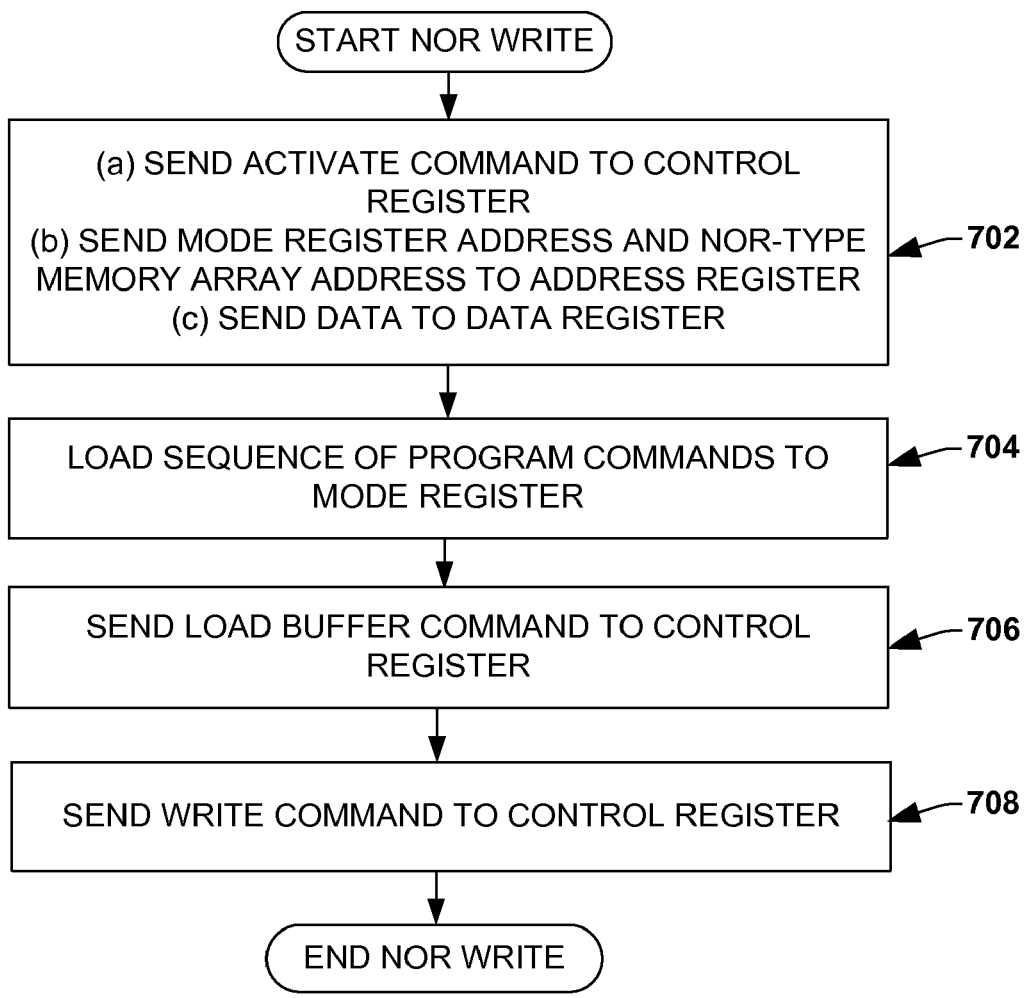
FIG. 7A shows a flow chart for a NOR-type flash memory array write operation.

FIG. 7A shows a command sequence communicated between the dynamic memory controller 212 and the NOR-type flash memory array 304 for a NOR memory write operation.

At 702 the write operation begins when the dynamic memory controller 212 concurrently sends an activate command, a mode register address and a NOR-type flash memory array address, and the data to be written to the dynamic bus interface associated with the NOR-type flash memory array.

At 704, the sequence of program commands is loaded into the dynamic bus interface associated with the NOR-type flash memory array.

At 706, the dynamic memory controller 212 sends a load buffer command to the dynamic bus interface associated with the NOR-type flash memory array.

At 708 the dynamic memory controller 212 sends a write command to the dynamic bus interface associated with the NOR-type flash memory array.

Figure 7B:
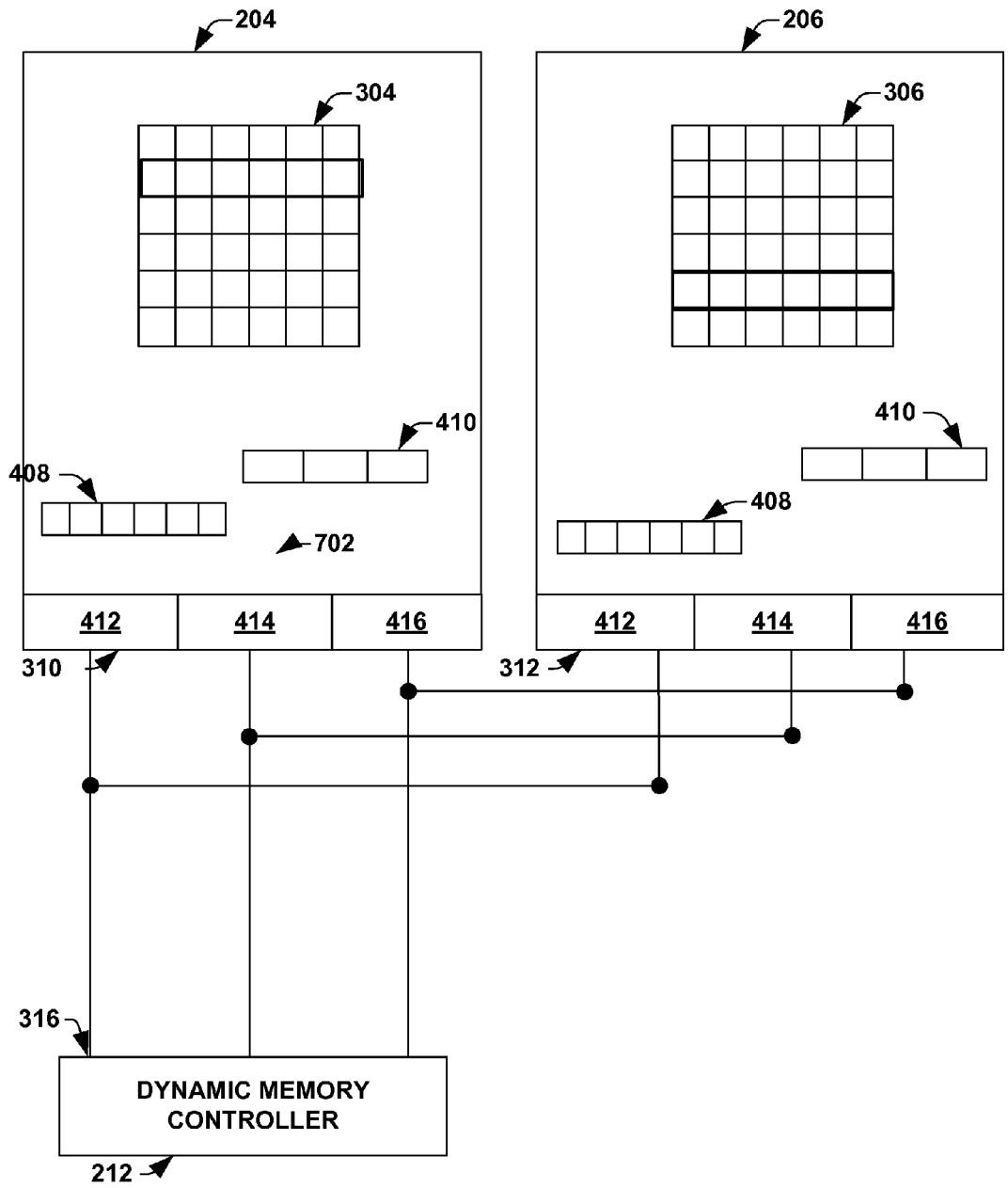
FIG. 7B shows a data flow associated with a NOR-type flash memory array write for the memory architecture of FIG. 3A.

A more detailed example of a method for writing to a NOR-type flash memory array, having the memory architecture shown in FIG. 3A, is now set fourth in FIG. 7B.

The write operation begins when the dynamic memory controller 212 concurrently sends an activate command to the control register 416, a mode register address and a NOR-type flash memory array address to the address register 412, and the data to be written to the data buffer to the data register 414. The activate command opens addresses to be written to in the mode register 410.

The sequence of program commands is then loaded into the mode register. The dynamic memory controller communicates the complex sequence of program commands to the first digital bus interface and the mode register. In one embodiment the sequence of program commands comprises a status bit, a unlock bit, a program bit, an erase bit, and a done bit. In another embodiment the sequence of program commands comprises a set of register write actions. The operations are written such that each bus cycle, a given command string is mapped into programming a set of registers. For example, at a first bus cycle, data A0 is loaded to address AAA, at a second bus cycle, data A1 is loaded to address 555, etc.

When the entire sequence of program commands has been loaded into the mode register 410, the NOR-type flash memory array will recognize that the sequence has been loaded into the mode register 410 and commence programming. Once the proper sequence of program commands is loaded into the mode register 410, the NOR-type flash memory array 304 will recognize the sequence and allow data to be written to the NOR-type flash memory array 304.

Figure 8:
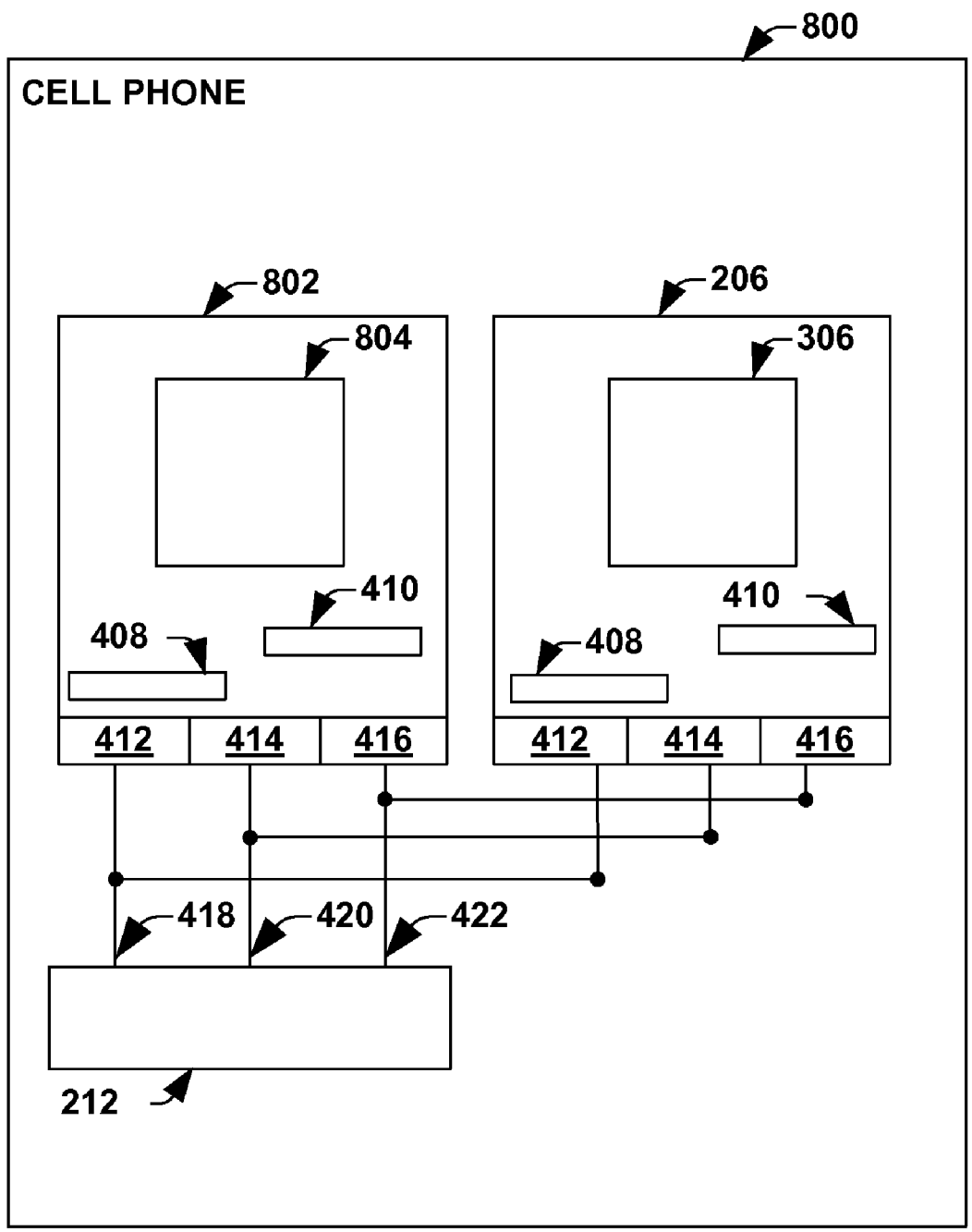
FIG. 8 shows a block diagram of a cell phone comprising an embodiment of a NVM/DRAM memory architecture of the present invention.

In an alternative embodiment, the sequence of program commands is used as a security measure in a cell phone 800 as shown in FIG. 8. The sequence of program commands provides exclusive access of the ability to write data to an NVM memory array 804 to a cell phone manufacturer or distributor possessing the proper sequence of program commands. This exclusive access would allow sensitive operating information to be written to the NVM memory array 804 by the manufacturer or distributor but prevent other parties from writing to the NVM memory array.

Next, the dynamic memory controller 212 sends a load buffer command to the control register 416. The load data command loads data from the data register 414 to the data buffer 408.

Finally, the dynamic memory controller 212 sends a write command to the control register 416. The write command copies data from the data buffer 408 to a NOR-type flash memory array location associated with the address stored in the address register 412. Other transactions can continue to occur on the DRAM bus while data is being loaded from the data buffer 408 to the NOR-type flash memory array. When programming is completed the NOR-type flash memory array will write a done bit into the mode register 410 which communicates to the dynamic memory array that programming of finished and communication can resume between the dynamic memory controller and the mode register.

Figure 7C:
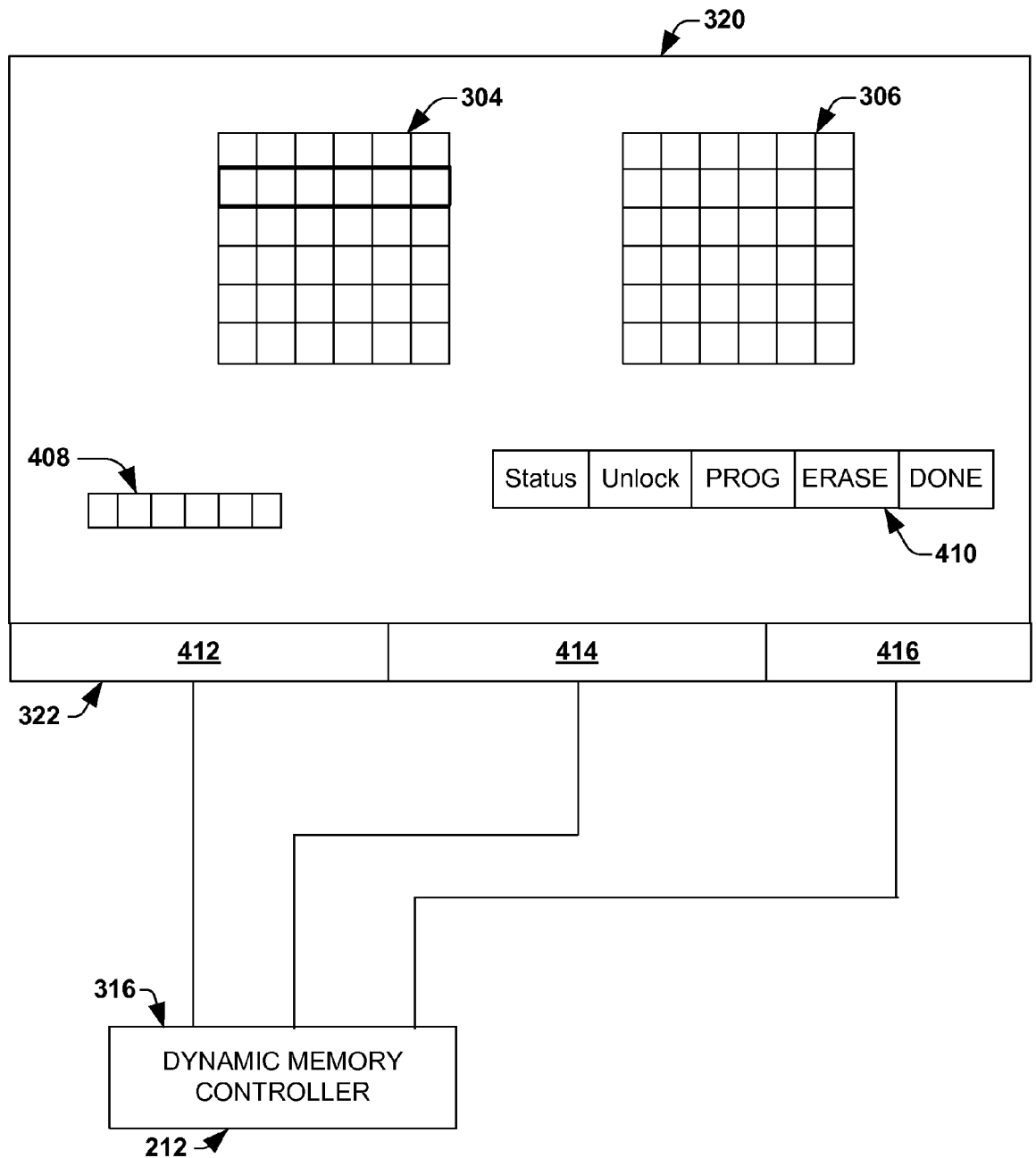
FIG. 7C shows the data flow associated with a NOR-type flash memory array write for the memory architecture of FIG. 3B.

FIG. 7C shows another detailed example of a method for writing to a NOR-type flash memory array having the memory architecture shown in FIG. 3B. The write operation sequence is the same as in FIG. 7B except that the commands are sent from the dynamic memory controller to the common digital bus interface 322.

In FIGS. 7A-7C, communicating commands from the dynamic memory controller 212 to the NOR-type flash memory array 304 without interfering with DRAM bus operation is achieved by translating any flash specific commands into a sequence of mode register accesses. The DRAM bus is used as a transport layer and the flash specific sequence will be programmed into a series of mode register write operations.

In FIGS. 3-7, the NOR-type flash memory array is connected to the DRAM buses in accordance with the standards set forth by JEDEC 42.4. Accordingly, a low power double data rate (LPDDR1) architecture is used for connection of the NOR-type flash memory array to the DRAM bus so that a high speed operation can occur. The double data rate architecture of the LPDDR1 standard is designed to transfers two data words per clock cycle at the I/O pins. It also allows pipelining of initial access latency among the NOR-type flash memory array and the DRAM memory array so long as they are attached to the same DRAM bus. The use of LPDDR1 is important for connection of flash memories to a DRAM bus as flash memories do not have the read bandwidth of a regular DDR DRAM. The JEDEC 42.4 specification further defines methods for power up initialization, bootmode, and address assignments that are common with the industry.

Furthermore, as the inventors have appreciated, the addition of an NOR-type flash memory array into a NVM/DRAM architecture as shown in FIGS. 3-7 is very advantageous. As stated earlier, the addition of an NOR-type flash memory array allows for an execute-in-place model (XiP) to be used in operation. When used in conjunction with non-volatile memory the XiP model drops power consumption. By design, NAND-type flash memory does not allow for the XiP model to be used due to the non-random access of memory cells allowed by its architecture and slow access times (~20 μs). Operation of code residing within the NAND-type flash memory therefore requires that the code be loaded into RAM for execution. To do this it is necessary to keep power intensive RAM memories active while the code is compressed, copied to the RAM memory, decompressed and then executed. This process can require a time period on the order of 10 seconds to perform causing slower run time and greater power consumption.

The figures of this specification have illustrated only selected features of a memory architecture as are necessary to describe the method of this embodiment and is not intended as a complete memory architecture. For example, a memory architecture as described by this embodiment would be used in conjunction with at least NAND and DRAM memory arrays and their support circuitry.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A non-volatile memory (NVM)/dynamic random access memory (DRAM) architecture comprising:
   a dynamic memory controller having a second dynamic bus interface;
   a NOR-type flash memory array having a first dynamic bus interface connected to the second dynamic bus interface, wherein the first dynamic bus interface comprises:
   an address register connected to an address bus and configured to store a mode register address;
   a data register connected to a data bus configured to receive data from the dynamic memory controller;
   a control register connected to a control bus configured to store a command received from the dynamic memory controller; and
   a mode register configured to store program commands received from the dynamic memory controller as a sequence of NOR-type flash memory program commands at a memory location corresponding to the mode register address stored in the address register; and
   a DRAM memory array having a third dynamic bus interface.

2. The memory architecture of claim 1, wherein the NOR-type flash memory is configured to separately execute the program commands stored in the mode register upon receipt of the entire sequence of NOR-type flash memory program commands.

3. The memory architecture of claim 2, further comprising a data buffer operably associated with the first dynamic bus interface, wherein the first dynamic bus interface communicates a data to be written to the NOR-type flash memory array from the dynamic memory controller to the data buffer.

4. The memory architecture of claim 3,
   wherein the second dynamic bus interface communicates a dynamic memory protocol to the first and third dynamic bus interfaces by way of at least one of: a shared data bus line coupling the first and third dynamic bus interfaces to the second dynamic bus interface, a shared control bus line coupling the first and third dynamic bus interfaces to the second dynamic bus interface, and a shared address bus line coupling the first and third dynamic bus interfaces to the second dynamic bus interface, wherein the shared data bus line, the shared control bus line and the shared address bus line are each separate lines that are distinct from one another; and
   wherein the NOR-type flash memory array and DRAM memory array receive the dynamic memory protocol from the dynamic memory controller via the at least one shared bus line.

5. The memory architecture of claim 1, wherein the sequence of program commands is read from the mode register by the NOR-type flash memory array, and wherein upon reading the sequence of program commands the NOR-type flash memory array permits transfer of the data stored in the data buffer to a location of the NOR-type flash memory array corresponding to a NOR address stored in the address register.

6. The memory architecture of claim 5, wherein each bus cycle a given command of the sequence of program commands is programmed into the mode register.

7. The memory architecture of claim 5, wherein the first dynamic bus interface is a DRAM interface.

8. The memory architecture of claim 7, further comprising:
   a NAND-type flash memory array with a first static bus interface; and
   a static memory controller with a second static bus interface;
   wherein the second static bus interface is coupled to the static memory controller and communicates static memory protocol to the first static bus interface, and wherein the NAND-type flash memory array receives static memory protocol from the static memory controller.

9. A method to communicate from a dynamic memory controller to a NOR-type flash memory array operably associated with a dynamic bus interface, comprising:
   transmitting an activate command from the dynamic memory controller along a control line to the dynamic bus interface of the NOR-type flash memory array to load a sequence of program commands to a memory location within a mode register operably associated with the dynamic bus interface, wherein the control line is shared between the NOR-type flash memory array and a dynamic RAM array, and wherein the memory location corresponds to a mode register address stored in an address register operably associated with the dynamic bus interface;

executing a load buffer command upon the NOR-type flash memory array reading the sequence of program commands from the mode register, wherein upon receiving the load buffer command, the NOR-type flash memory array loads data corresponding to the sequence of program commands to a data buffer operably associated with the dynamic bus interface, wherein the load buffer command is transmitted to the NOR-type flash memory array along a data line that is shared with the dynamic RAM array; and executing a write command to write the data from the data buffer to a row of the NOR-type flash memory array associated with a NOR address row stored in the dynamic bus interface.

10. The method of claim 9, wherein the sequence of program commands is translated into a series of mode register write operations and wherein the series of mode register write operations are programmed into the mode register by transmitting the series of mode register write operations from the dynamic bus interface to the mode register.

11. The method of claim 9, wherein upon completion of writing the data stored in the data buffer to the row of the NOR-type flash memory array the NOR-type flash memory array writes a done bit to the mode register, and wherein upon reading the done bit the dynamic memory controller sends the activate command to the dynamic bus interface to start another write process.

12. The method of claim 9, further comprising a series of commands configured to communicate from the dynamic memory controller to a DRAM memory array, comprising a DRAM activate command, wherein upon reading the DRAM activate command from the dynamic bus interface the DRAM memory array opens a memory row corresponding to an associated DRAM address stored in the dynamic bus interface;

a DRAM load buffer command, wherein upon reading the DRAM load buffer command from the dynamic bus interface the DRAM memory array copies data from a data bus to the data buffer; and a DRAM write command, wherein upon reading the DRAM write command from the dynamic bus interface the DRAM memory array writes the data stored in the data buffer to the open memory row of the DRAM memory array.

13. The method of claim 12, wherein the DRAM memory array is operably associated with an additional dynamic bus interface.

14. The method of claim 9, wherein the sequence of program commands comprises a status bit, a unlock bit, a program bit, an erase bit, and a done bit.

15. The method of claim 9, wherein the dynamic bus interface is comprised of the address register, a data register and a control register.

16. The method of claim 15, wherein each bus cycle a given command of the sequence of program commands is programmed into the mode register.

17. The memory architecture of claim 1, wherein the dynamic memory controller is configured to concurrently send an activate command to the control register, a mode register address to the address register, and data to be written to the data register.

18. The memory architecture of claim 2, wherein the NOR-type flash memory array is configured to write a done bit into the mode register when execution of the sequence of NOR-type flash memory program commands has been completed.

* * * * *